United States Patent
Ikeda et al.

(10) Patent No.: US 8,157,877 B2
(45) Date of Patent: Apr. 17, 2012

(54) CHEMICAL MECHANICAL POLISHING AQUEOUS DISPERSION, CHEMICAL MECHANICAL POLISHING METHOD, AND KIT FOR PREPARING CHEMICAL MECHANICAL POLISHING AQUEOUS DISPERSION

(75) Inventors: Norihiko Ikeda, Suzuka (JP); Tomikazu Ueno, Yokkaichi (JP)

(73) Assignee: JSR Corporation, Tokyo (JP)

( * ) Notice: Subject to any disclaimer, the term of this patent is extended or adjusted under 35 U.S.C. 154(b) by 766 days.

(21) Appl. No.: 12/097,361

(22) PCT Filed: Dec. 4, 2006

(86) PCT No.: PCT/JP2006/324168
§ 371 (c)(1),
(2), (4) Date: Oct. 16, 2008

(87) PCT Pub. No.: WO2007/069488
PCT Pub. Date: Jun. 21, 2007

(65) Prior Publication Data
US 2009/0165395 A1    Jul. 2, 2009

(30) Foreign Application Priority Data
Dec. 16, 2005 (JP) .................................. 2005-362688

(51) Int. Cl.
*B24D 3/02* (2006.01)
*C09C 1/68* (2006.01)
*C09K 3/14* (2006.01)
*C09K 13/00* (2006.01)
*H01L 21/302* (2006.01)
*H01L 21/461* (2006.01)

(52) U.S. Cl. .............. 51/309; 252/79.1; 438/692; 106/3

(58) Field of Classification Search ........ 106/3; 51/309; 438/692; 516/9; 252/79.1
See application file for complete search history.

(56) References Cited

U.S. PATENT DOCUMENTS

| | | | |
|---|---|---|---|
| 4,601,755 A * | 7/1986 | Melard et al. ........ | 106/3 |
| 5,994,260 A * | 11/1999 | Bonneau et al. ........ | 502/304 |
| 6,786,944 B2 | 9/2004 | Hattori et al. | |
| 7,252,782 B2 | 8/2007 | Ikeda et al. | |
| 2005/0036928 A1 | 2/2005 | Katusic et al. | |
| 2006/0010781 A1 | 1/2006 | Ikeda et al. | |
| 2006/0186089 A1 | 8/2006 | Shida et al. | |
| 2006/0201914 A1 | 9/2006 | Uchikura et al. | |
| 2006/0276041 A1 | 12/2006 | Uchikura et al. | |

FOREIGN PATENT DOCUMENTS

| | | | |
|---|---|---|---|
| CN | 1453328 A | | 11/2003 |
| EP | 0 820 092 A1 | | 1/1998 |
| EP | 1 043 379 A1 | | 10/2000 |
| EP | 1 566 420 A1 | | 8/2005 |
| JP | 60 235631 | | 11/1985 |
| JP | 5 326469 | | 12/1993 |
| JP | 9 270402 | | 10/1997 |
| JP | 2000 109804 | | 4/2000 |
| JP | 2000 109809 | | 4/2000 |
| JP | 2001 7061 | | 1/2001 |
| JP | 2001 185514 | | 7/2001 |
| JP | 2004 153286 | | 5/2004 |
| JP | 2004 269577 | | 9/2004 |
| JP | 2005 97445 | | 4/2005 |
| JP | 2005-109452 | | 4/2005 |
| WO | WO 01/81490 | * | 11/2000 |
| WO | WO 00/73396 A1 | | 12/2000 |
| WO | WO 01/81490 A2 | | 11/2001 |
| WO | WO 01/81490 A3 | | 11/2001 |

OTHER PUBLICATIONS

U.S. Appl. No. 12/295,673, filed Oct. 1, 2008, Uchikura, et al.
U.S. Appl. No. 12/295,872, filed Oct. 3, 2008, Takemura, et al.
U.S. Appl. No. 12/297,949, filed Oct. 21, 2008, Namie, et al.
U.S. Appl. No. 12/374,074, filed Jan. 16, 2009, Andou, et al.
U.S. Appl. No. 12/373,897, filed Jan. 15, 2009, Ueno, et al.
U.S. Appl. No. 12/676,272, filed Mar. 3, 2010, Takemura, et al.
U.S. Appl. No. 12/749,934, filed Mar. 30, 2010, Shida, et al.
U.S. Appl. No. 12/127,334, filed May 27, 2008, Kunitani, et al.
U.S. Appl. No. 12/467,729, filed May 18, 2009, Kunitani, et al.
U.S. Appl. No. 12/866,571, filed Aug. 6, 2010, Shida, et al.
U.S. Appl. No. 12/918,013, filed Aug. 17, 2010, Shida, et al.
U.S. Appl. No. 12/867,954, filed Aug. 17, 2010, Motonari, et al.
U.S. Appl. No. 12/919,897, filed Aug. 27, 2010, Nishimoto, et al.
U.S. Appl. No. 12/537,766, filed Aug. 7, 2009, Abe, et al.
U.S. Appl. No. 12/529,545, filed Sep. 2, 2009, Matsumoto, et al.
Extended European Search Report issued Oct. 19, 2010 in Patent Application No. 06823573.8.

* cited by examiner

*Primary Examiner* — Jerry Lorengo
*Assistant Examiner* — Pegah Parvini
(74) *Attorney, Agent, or Firm* — Oblon, Spivak, McClelland, Maier & Neustadt, L.L.P.

(57) ABSTRACT

A chemical mechanical polishing aqueous dispersion includes (A) abrasive grains having a pore volume of 0.14 ml/g or more, and (B) a dispersion medium.

11 Claims, 2 Drawing Sheets

CHEMICAL MECHANICAL POLISHING AQUEOUS DISPERSION, CHEMICAL MECHANICAL POLISHING METHOD, AND KIT FOR PREPARING CHEMICAL MECHANICAL POLISHING AQUEOUS DISPERSION

This application is a 371 of PCT/JP2006/324168 filed Dec. 4, 2006.

TECHNICAL FIELD

The present invention relates to a chemical mechanical polishing aqueous dispersion, a chemical mechanical polishing method, and a kit for preparing a chemical mechanical polishing aqueous dispersion.

BACKGROUND ART

The storage capacity of memory devices has remarkably increased along with an increase in the degree of integration and the number of layers of semiconductor devices, for example. This is implemented by the progress in microfabrication technology. On the other hand, the chip size has increased in spite of an increase in the number of layers and the like. Moreover, the number of production steps has increased along with microfabrication to increase the chip cost. In such a situation, chemical mechanical polishing technology has been used to polish a processed film and the like, and has attracted attention. Microfabrication technologies such as planarization have been implemented by applying the chemical mechanical polishing technology.

Shallow trench isolation (STI) technology is known as such a microfabrication technology, for example. The STI technology utilizes chemical mechanical polishing in order to remove unnecessary insulating layer deposited on a wafer substrate. Since the flatness of a polishing target surface is important in the chemical mechanical polishing step, various abrasive agents have been studied.

For example, JP-A-5-326469 and JP-A-9-270402 disclose that the polishing rate in the STI chemical mechanical polishing step is increased using an aqueous dispersion utilizing ceria as abrasive grains while achieving a polished surface with a relatively small number of scratches.

In recent years, a further increase in yield and throughput of semiconductor elements has been desired along with a further increase in the number of layers and a reduction in line width of semiconductor devices. Therefore, chemical mechanical polishing technology which substantially does not produce scratches on a polished surface and achieves high-speed polishing has been desired.

The number of scratches on the polished surface is effectively reduced using a surfactant such as chitosan acetate, dodecylamine, or polyvinylpyrrolidone (see JP-A-2000-109809, JP-A-2001-7061, and JP-A-2001-185514, for example). However, since the polishing rate decreases when using such technology, an increase in throughput has not yet been achieved.

DISCLOSURE OF THE INVENTION

In view of the above-described situation of the semiconductor device production technology, an object of the invention is to provide a chemical mechanical polishing aqueous dispersion which can maintain a sufficient polishing rate and significantly reduce scratches, a chemical mechanical polishing method using the chemical mechanical polishing aqueous dispersion, and a kit for preparing a chemical mechanical polishing aqueous dispersion.

According to one aspect of the invention, there is provided a chemical mechanical polishing aqueous dispersion comprising (A) abrasive grains having a pore volume of 0.14 ml/g or more, and (B) a dispersion medium.

In the above chemical mechanical polishing aqueous dispersion, the abrasive grains (A) may have a specific surface area determined by a BET method of 15.0 $m^2/g$ or more, and a D99 value of 1 micrometer or less, the D99 value being a particle diameter when a total volume ratio obtained by integrating a volume ratio of particles in an ascending order of particle diameter reaches 99% in a volume particle size distribution obtained by particle size distribution measurement using laser diffractometry.

In the above chemical mechanical polishing aqueous dispersion, the abrasive grains (A) may include ceria.

The above chemical mechanical polishing aqueous dispersion may include either or both of (C) a water-soluble polymer and (D) auxiliary particles.

The above chemical mechanical polishing aqueous dispersion may include 100 parts by mass of inorganic particles containing ceria as the abrasive grains (A), 5 to 100 parts by mass of an anionic water-soluble polymer as the water-soluble polymer (C), and 5 to 100 parts by mass of cationic organic polymer particles as the auxiliary particles (D).

According to another aspect of the invention, there is provided a chemical mechanical polishing method comprising polishing and planarizing a conductive layer or an insulating layer in the production of semiconductor devices using the above chemical mechanical polishing aqueous dispersion.

According to another aspect of the invention, there is provided a chemical mechanical polishing method comprising polishing and planarizing a conductive layer or an insulating layer in the production of semiconductor devices using a dispersion obtained by mixing the above chemical mechanical polishing aqueous dispersion and at least one component selected from (B) a dispersion medium, (C) a water-soluble polymer, (D) auxiliary particles, (E) a pH adjusting agent, (F) a surfactant, and (G) a preservative.

According to another aspect of the invention, there is provided a kit for preparing a chemical mechanical polishing aqueous dispersion by mixing a first liquid and a second liquid, the kit comprising the first liquid and the second liquid, the first liquid being the above chemical mechanical polishing aqueous dispersion, and the second liquid comprising at least one component selected from (B) a dispersion medium, (C) a water-soluble polymer, (D) auxiliary particles, (E) a pH adjusting agent, (F) a surfactant, and (G) a preservative.

A conductive layer or an insulating layer can be planarized without significantly decreasing the polishing rate while significantly reducing scratches using the above chemical mechanical polishing aqueous dispersion as an abrasive material when planarizing a conductive layer or an insulating layer in the production of semiconductor devices. Therefore, the above chemical mechanical polishing aqueous dispersion is effective for improving the productivity and the yield of semiconductor devices.

Specifically, since the abrasive grains (A) of the above chemical mechanical polishing aqueous dispersion have a pore volume of 0.14 ml/g or more, a large amount of pressure produced when causing the abrasive grains (A) to come into contact with a polishing target material can be released through a minute space in the abrasive grains (A). This prevents a situation in which the pressure is concentrated on one point of the abrasive grains (A). Therefore, scratches can be significantly reduced.

An even space can be formed between a polishing target material and a polishing pad using the auxiliary particles (D) in the above chemical mechanical polishing aqueous dispersion. Therefore, pressure applied to the abrasive grains (A) and the polishing target material can be maintained within a specific range, whereby scratches can be further reduced.

According to the above chemical mechanical polishing method and the above kit for preparing a chemical mechanical polishing aqueous dispersion, a conductive layer or an insulating layer can be planarized without significantly decreasing the polishing rate while significantly reducing scratches using the above chemical mechanical polishing aqueous dispersion as an abrasive material when producing semiconductor devices. Therefore, the above chemical mechanical polishing method and the above kit are effective for improving the productivity and the yield of semiconductor devices.

BEST MODE FOR CARRYING OUT THE INVENTION

1. Chemical Mechanical Polishing Aqueous Dispersion

Figure 1:
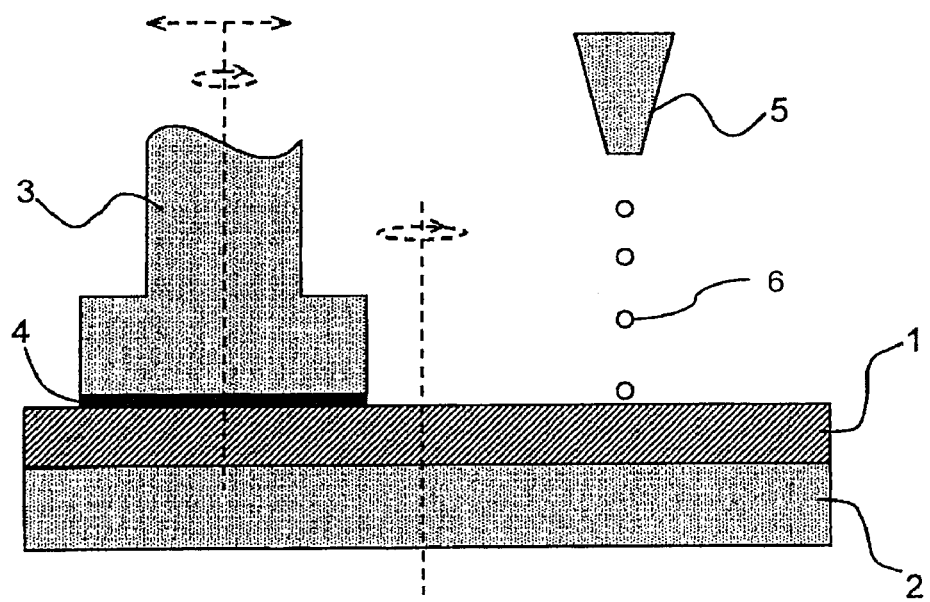
FIG. 1 is a schematic view showing an example of a chemical mechanical polishing method according to second and third aspects of the invention.

A chemical mechanical polishing aqueous dispersion according to one embodiment of the invention comprises (A) abrasive grains having a pore volume of 0.14 ml/g or more, and (B) a dispersion medium. Each component included in the chemical mechanical polishing aqueous dispersion according to one embodiment of the invention is described in detail below.

1.1. Abrasive Grains (A)

As the abrasive grains (A), inorganic particles may be used.

As the inorganic particles, one or more components selected from ceria, silica, alumina, titanium oxide, chromium oxide, manganese dioxide, manganic oxide, iron oxide, zirconium oxide, silicon carbide, boron carbide, diamond, barium carbonate, and the like may be used.

The inorganic particles preferably include ceria, and more preferably further include one or more components selected from silica, alumina, titanium oxide, chromium oxide, manganese dioxide, manganic oxide, iron oxide, zirconium oxide, silicon carbide, boron carbide, diamond, barium carbonate, and the like. It is still more preferable to use ceria. Ceria may be produced by firing a cerium compound, for example. Examples of the cerium compound used as the raw material include cerium carbonate, cerium nitrate, cerium oxalate, and the like. The firing temperature is preferably 300° C. or more, and more preferably about 600 to 900° C.

Abrasive grains may also be used in which the surface of the inorganic particles is partially or entirely covered with another component. The above-mentioned components may be used as such a component, for example.

Examples of silica include fumed silica, colloidal silica, and the like. Fumed silica may be obtained by reacting silicon chloride with hydrogen and oxygen, for example. Colloidal silica may be obtained by a method of subjecting a silicate compound to an ion-exchange reaction, a method of subjecting an alkoxysilicon compound to hydrolysis and condensation, or the like.

When the inorganic particles are formed of a mixture of ceria and other inorganic particles, the ceria content of the inorganic particles is preferably 60 mass % or more, and more preferably 90 mass % or more.

The inorganic particles are preferably formed only of ceria or formed of ceria and silica, and more preferably formed only of ceria.

The abrasive grains (A) preferably have a pore volume of 0.14 ml/g or more, more preferably 0.14 ml/g or more and 0.30 ml/g or less, and still more preferably 0.15 ml/g or more and 0.25 ml/g or less.

If the abrasive grains (A) have a pore volume of less than 0.14 ml/g, the abrasive grains (A) may produce a large number of scratches and may not be suitable as a component of the chemical mechanical polishing aqueous dispersion. If the abrasive grains (A) have a pore volume of more than 0.30 ml/g, the polishing rate may be insufficient.

The pore volume of the abrasive grains (A) may be determined by measuring the pore volume of the dried abrasive grains (A) using a known method such as a gas adsorption BET multipoint method. A gas used for gas adsorption is not particularly limited insofar as the gas does not react with the abrasive grains (A). For example, an inert gas such as nitrogen, helium, argon, or krypton is preferably used. The pore volume of the abrasive grains (A) may be determined by measuring an adsorption isotherm by a BET multipoint method and analyzing the adsorption isotherm by the Barrett-Joyner-Halenda (BJH) method.

The pore volume of the abrasive grains (A) may be controlled by changing the abrasive grain production conditions. For example, when using ceria as the abrasive grains (A), ceria may be obtained by firing a cerium compound as a raw material. In this case, the pore volume can be controlled by changing the firing temperature of the cerium compound (raw material), fired product grinding conditions, classification conditions, and the like.

The pore volume of the resulting abrasive grains (A) generally decreases when increasing the firing temperature when producing the abrasive grains (A) by firing. The polishing rate increases as the pore volume of the abrasive grains (A) decreases. On the other hand, a large number of scratches tend to be produced on a polishing target material. The pore volume of the resulting abrasive grains (A) increases when decreasing the firing temperature when producing the abrasive grains (A) by firing. The polishing rate tends to decrease to a large extent as the pore volume of the abrasive grains (A) increases.

The abrasive grains (A) preferably have a specific surface area determined by the BET method (BET specific surface area of the abrasive grains (A)) of 15.0 $m^2/g$ or more, more preferably 15.0 $m^2/g$ or more and 50.0 $m^2/g$ or less, and still more preferably 20.0 $m^2/g$ or more and 50.0 $m^2/g$ or less. Abrasive grains having excellent flatness can be obtained using the abrasive grains (A) having a specific surface area within this range.

If the BET specific surface area of the abrasive grains (A) is less than 15.0 $m^2/g$, the abrasive grains (A) may produce a large number of scratches and may not be suitable as a component of the chemical mechanical polishing aqueous dispersion, although the polishing rate increases. If the BET specific surface area of the abrasive grains (A) is more than 50.0 $m^2/g$, the polishing rate may be insufficient.

The abrasive grains (A) preferably have an average particle diameter of 0.01 to 1 micrometer, more preferably 0.02 to 0.7 micrometers, and still more preferably 0.04 to 0.3 micrometers. The average particle diameter of the abrasive grains (A) may be measured using a dynamic light scattering method, a laser scattering diffraction method, transmission electron microscopy, or the like. It is preferable to measure the average particle diameter of the abrasive grains (A) using a laser scattering diffraction method due to convenience.

The abrasive grains (A) preferably have a D99 value determined by particle size distribution measurement using laser diffractometry of 1 micrometer or less, more preferably 0.2 micrometers or more and 0.8 micrometers or less, and still more preferably 0.2 micrometers or more and 0.6 micrometers or less.

If the abrasive grains (A) have a D99 value of less than 0.2 micrometers, the abrasive grains (A) may exhibit a low polishing rate and may not be suitable as a component of the chemical mechanical polishing aqueous dispersion. If the abrasive grains (A) have a D99 value of more than 1 micrometer, the abrasive grains (A) may produce a large number of scratches and may not be suitable as a component of the chemical mechanical polishing aqueous dispersion.

The particle size distribution of the abrasive grains (A) may be measured using laser diffractometry in a state in which the abrasive grains (A) are dispersed in water.

The term "D99 value" refers to a particle diameter when a total volume ratio obtained by integrating a volume ratio of particles in an ascending order of particle diameter reaches 99% in a volume particle size distribution obtained by particle size distribution measurement using laser diffractometry.

An abrasive material having an excellent balance between the polishing rate and the dispersion stability in an aqueous dispersion can be obtained using inorganic particles having an average particle diameter and a pore volume within the above ranges.

The content of the abrasive grains (A) in the chemical mechanical polishing aqueous dispersion according to this embodiment is preferably 5 mass % or less, more preferably 0.02 to 5 mass %, still more preferably 0.05 to 3 mass %, and particularly preferably 0.1 to 2 mass % based on 100 mass % of the chemical mechanical polishing aqueous dispersion.

If the content of the abrasive grains (A) exceeds 5 mass %, the chemical mechanical polishing aqueous dispersion may be easily dried so that a large dried powder may be formed, whereby the number of scratches may increase. If the content of the abrasive grains (A) is less than 0.02 mass %, the polishing rate may decrease, whereby efficient polishing may not be achieved.

1.2. Dispersion Medium (B)

Examples of the dispersion medium (B) included in the chemical mechanical polishing aqueous dispersion according to this embodiment include water, a mixed medium containing water and an alcohol, a mixed medium containing water and an organic solvent which is miscible with water, and the like. Examples of the alcohol include methanol, ethanol, 1-propanol, 2-propanol, and the like. Examples of the organic solvent which is miscible with water include acetone, methyl ethyl ketone, and the like. Of these, it is preferable to use water or a mixed medium containing water and the alcohol.

The chemical mechanical polishing aqueous dispersion according to this embodiment includes the abrasive grains (A) and the dispersion medium (B) as essential components, and may further include at least one component selected from (C) a water-soluble polymer, (D) auxiliary particles, (E) a pH adjusting agent, (F) a surfactant, and (G) a preservative, as required. It is preferable that the chemical mechanical polishing aqueous dispersion according to this embodiment include either or both of the water-soluble polymer (C) and the auxiliary particles (D), for example.

1.3. Water-Soluble Polymer (C)

It is preferable that the chemical mechanical polishing aqueous dispersion according to this embodiment further include the water-soluble polymer (C). Examples of the water-soluble polymer (C) include a cationic water-soluble polymer having a cationic functional group, an anionic water-soluble polymer having an anionic functional group, and a nonionic water-soluble polymer which does not have cationic and anionic functional groups.

Specific examples of the water-soluble polymer (C) include (1) polycarboxylic acids such as poly(meth)acrylic acid, polyitaconic acid, polyfumaric acid, and polymaleic acid, a poly(meth)acrylic acid copolymer, ammonium salts, alkylammonium salts (the number of carbon atoms of the alkyl group is preferably 1 or 2), and potassium salts thereof, (2) polystyrenesulfonic acid, polyisoprenesulfonic acid, ammonium salts, and potassium salts thereof, (3) a copolymer of a vinyl monomer (e.g., acrylic acid, methacrylic acid, styrenesulfonic acid (or its salt), naphthalenesulfonic acid (or its salt), or isoprenesulfonic acid (or its salt)) and a hydrophilic (meth)acrylamide monomer, (4) a copolymer of a vinyl monomer (e.g., acrylic acid, methacrylic acid, styrenesulfonic acid (or its salt), naphthalenesulfonic acid (or its salt), or isoprenesulfonic acid (or its salt)) and (meth)acrylate and a hydrophobic aromatic monomer, (5) polyglutamic acid obtained by subjecting glutamic acid to polycondensation, (6) nitrogen-containing polymers such as polyvinylpyrrolidone, polyacrylamide, and polyethylenimine, and the like.

As the water-soluble polymer (C), it is preferable to use a cationic water-soluble polymer having a nitrogen atom or an anionic water-soluble polymer having a carboxyl group and a sulfone group in its repeating unit.

Specifically, polycarboxylic acids such as poly(meth)acrylic acid, polyitaconic acid, polyfumaric acid, and polymaleic acid, a poly(meth)acrylic acid copolymer, ammonium salts, alkylammonium salts (the number of carbon atoms of the alkyl group is preferably 1 or 2), and potassium salts thereof, and nitrogen-containing polymers such as polyvinylpyrrolidone, polyacrylamide, and polyethylenimine are preferable. These water-soluble polymers may be used either individually or in combination of two or more.

An anionic water-soluble polymer is preferable as the water-soluble polymer (C). The anionic water-soluble polymer is preferably a water-soluble polymer having an anionic functional group. Examples of the anionic functional group contained in the anionic water-soluble polymer include a carboxyl group, a sulfone group, and the like.

Examples of the anionic water-soluble polymer having a carboxyl group as the anionic functional group include an unsaturated carboxylic acid (co)polymer, polyglutamic acid, polymaleic acid, and the like. Examples of the anionic water-soluble polymer having a sulfone group as the anionic functional group include a (co)polymer of unsaturated monomers having a sulfone group, and the like.

The above-mentioned unsaturated carboxylic acid (co)polymer refers to an unsaturated carboxylic acid homopolymer or a copolymer of an unsaturated carboxylic acid and a monomer other than the unsaturated carboxylic acid. Examples of the unsaturated carboxylic acid include (meth)acrylic acid and the like. Examples of the monomer other than the unsaturated carboxylic acid include (meth)acrylamide, (meth)acrylate, styrene, butadiene, isoprene, and the like. Examples of the (meth)acrylate include methyl (meth)acrylate, ethyl (meth)acrylate, benzyl (meth)acrylate, and the like.

The above-mentioned (co)polymer of unsaturated monomers having a sulfone group refers to a homopolymer of unsaturated monomers having a sulfone group or a copolymer of an unsaturated monomer having a sulfone group and a monomer other than the unsaturated monomer having a sulfone group. Examples of the unsaturated monomer having a sulfone group include styrenesulfonic acid, naphthalenesulfonic acid, isoprenesulfonic acid, and the like. As the monomer other than the unsaturated monomer having a sulfone group, a monomer may be used which is similar to the monomer mentioned above as the raw material for the unsaturated carboxylic acid copolymer.

Of these anionic water-soluble polymers, the unsaturated carboxylic acid (co)polymer may be preferably used. In particular, poly(meth)acrylic acid is preferable.

All or some of the anionic groups contained in the water-soluble organic polymer may be salts. Examples of a counter cation include an ammonium ion, an alkylammonium ion, a potassium ion, and the like. Of these, an ammonium ion or an alkylammonium ion is preferable.

The polyethylene glycol-reduced weight average molecular weight of the water-soluble polymer (C) determined by gel permeation chromatography (GPC) (solvent: water) is preferably 1000 to 1,000,000, more preferably 4000 to 800,000, still more preferably 5000 to 100,000, and most preferably 5000 to 20,000. If the weight average molecular weight of the water-soluble polymer (C) is less than 3000, the dispersibility of the abrasive grains may decrease. Surface defects of a polishing target surface are effectively reduced using the water-soluble polymer (C) having a weight average molecular weight within above range.

The content of the water-soluble polymer (C) in the chemical mechanical polishing aqueous dispersion according to this embodiment is preferably 1 to 600 parts by mass, more preferably 10 to 500 parts by mass, still more preferably 20 to 400 parts by mass, and particularly preferably 5 to 100 parts by mass based on 100 parts by mass of the abrasive grains (A).

If the content of the water-soluble polymer (C) is less than 1 part by mass based on 100 parts by mass of the abrasive grains (A), the dispersibility of the abrasive grains may deteriorate. If the content of the water-soluble polymer (C) is more than 600 parts by mass based on 100 parts by mass of the abrasive grains (A), the polishing rate may decrease.

1.4. Auxiliary Particles (D)

It is preferable that the chemical mechanical polishing aqueous dispersion according to this embodiment further include the auxiliary particles (D). As the auxiliary particles (D), at least one of organic particles and organic-inorganic composite particles may be used, for example.

Examples of an organic material for the organic particles include thermoplastic resins such as polyvinyl chloride, polystyrene, a styrene copolymer, polyacetal, a saturated polyester, polyamide, polycarbonate, a polyolefin such as polyethylene, polypropylene, poly-1-butene, and poly-4-methyl-1-pentene, an olefin copolymer, a phenoxy resin, and (meth)acrylic resin such as polymethyl methacrylate; copolymer resins having a crosslinked structure obtained by copolymerizing styrene, methyl methacrylate, or the like with divinylbenzene, ethylene glycol dimethacrylate, or the like; thermosetting resins such as a phenol resin, a urea resin, a melamine resin, an epoxy resin, an alkyd resin, and a unsaturated polyester resin; and the like.

These materials for the organic particles may be used either individually or in combination of two or more. The organic particles may be produced using an emulsion polymerization method, a suspension polymerization method, an emulsion dispersion method, a grinding method, or the like.

Examples of the organic-inorganic composite particles include particles produced by subjecting an alkoxysilane to polycondensation in a state in which inorganic particles and organic particles are mixed so that a polysiloxane or the like is bonded to at least the surface of the organic particles, particles in which inorganic particles formed of silica, ceria, or the like are bonded to organic particles due to electrostatic force or the like, and the like. It is preferable to use particles in which inorganic particles formed of ceria are bonded to organic particles since a sufficient polishing rate can be maintained while significantly reducing scratches.

The above-mentioned polysiloxane or the like may be directly bonded to an anion group of the organic particle, or may be indirectly bonded to an anion group of the organic particle through a silane coupling agent or the like.

The auxiliary particles (D) preferably have an average dispersion particle diameter of 0.01 to 1 micrometer, and more preferably 0.05 to 0.5 micrometers. If the auxiliary particles (D) have an average particle diameter of more than 1 micrometer, the auxiliary particles (D) may precipitate or be separated, whereby a stable chemical mechanical polishing aqueous dispersion may not be obtained.

The average particle diameter of the auxiliary particles (D) may be measured using a dynamic light scattering device, a laser scattering diffractometer, a transmission electron microscope, or the like. The average particle diameter of the auxiliary particles (D) may be calculated based on data relating to the specific surface area of the dried auxiliary particles (D).

The auxiliary particles (D) are preferably cationic organic polymer particles.

The term "cationic organic polymer particles" used herein refer to organic particles having a positively-charged surface. The cationic organic polymer particles may have a cationic group. For example, the cationic organic polymer particles may have a group shown by any of the following formulas (1) to (4). The cationic organic polymer particles may be obtained by polymerizing monomers having a cationic group, or polymerizing monomers using an initiator having a cationic group, for example.

(1)

(2)

(3)

(4)

wherein R individually represents a hydrogen atom, an aliphatic hydrocarbon group having 1 to 30 carbon atoms, or an aryl group having 6 to 30 carbon atoms, preferably a hydrogen atom or an alkyl group having 1 to 4 carbon atoms, and more preferably a hydrogen atom or a methyl group. R' represents a hydrogen atom, an aliphatic hydrocarbon group having 1 to 30 carbon atoms, or an aryl group having 6 to 30 carbon atoms.

The cationic organic polymer particles are not particularly limited. For example, the cationic organic polymer particles may be polymer particles having a cationic residue, polymer particles to which a surfactant having a cationic residue adheres, or the like.

When the cationic organic polymer particles are polymer particles having a cationic residue, the cationic residue may be at least positioned in the side chain or at the terminal of the polymer.

A polymer having a cationic residue in the side chain may be produced by homopolymerization of cationic monomers, copolymerization of two or more types of cationic monomers, or copolymerization of a cationic monomer and a monomer other than the cationic monomer.

Examples of the cationic monomer include an aminoalkyl group-containing (meth)acrylate, an aminoalkoxyalkyl group-containing (meth)acrylate, an N-aminoalkyl group-containing (meth)acrylate, and the like.

Examples of the aminoalkyl group-containing (meth)acrylate include 2-dimethylaminoethyl (meth)acrylate, 2-diethylaminoethyl (meth)acrylate, 2-dimethylaminopropyl (meth)acrylate, 3-dimethylaminopropyl (meth)acrylate, and the like. Examples of the aminoalkoxyalkyl group-containing (meth)acrylate include 2-(dimethylaminoethoxy)ethyl (meth)acrylate, 2-(diethylaminoethoxy)ethyl (meth)acrylate, 3-(dimethylaminoethoxy)propyl (meth)acrylate, and the like. Examples of the N-aminoalkyl group-containing (meth)acrylate include N-(2-dimethylaminoethyl)(meth)acrylamide, N-(2-diethylaminoethyl)(meth)acrylamide, N-(2-dimethylaminopropyl)(meth)acrylamide, N-(3-dimethylaminopropyl)(meth)acrylamide, and the like.

Of these, 2-dimethylaminoethyl (meth)acrylate and N-(2-dimethylaminoethyl)(meth)acrylamide are preferable.

These cationic monomers may be in the form of a salt to which methyl chloride, dimethyl sulfate, diethyl sulfate, or the like is added. When the cationic monomer is in the form of a salt, a salt to which methyl chloride is added is preferable.

Examples of the monomer other than the cationic monomer include an aromatic vinyl compound, an unsaturated nitrile compound, a (meth)acrylate (excluding the (meth)acrylates corresponding to the cationic monomer), a conjugated diene compound, vinyl carboxylate, halogenated vinylidene, and the like.

Examples of the aromatic vinyl compound include styrene, alpha-methylstyrene, p-methylstyrene, halogenated styrene, and the like. Examples of the unsaturated nitrile compound include acrylonitrile and the like. Examples of the (meth)acrylate (excluding the (meth)acrylates corresponding to the cationic monomer) include methyl (meth)acrylate, ethyl (meth)acrylate, butyl (meth)acrylate, cyclohexyl (meth)acrylate, 2-ethylhexyl (meth)acrylate, lauryl (meth)acrylate, glycidyl (meth)acrylate, 2-hydroxyethyl (meth)acrylate, and the like. Examples of the conjugated diene compound include butadiene, isoprene, and the like. Examples of the vinyl carboxylate include vinyl acetate and the like. Examples of the halogenated vinylidene include vinyl chloride, vinylidene chloride, and the like.

Of these, styrene, alpha-methylstyrene, acrylonitrile, methyl methacrylate, butyl methacrylate, 2-hydroxyethyl acrylate, and trimethylolpropane trimethacrylate are preferable.

The cationic monomer may be further copolymerized with a monomer having two or more polymerizable unsaturated bonds, if necessary.

Examples of such a monomer include divinylbenzene, divinylbiphenyl, ethylene glycol di(meth)acrylate, diethylene glycol di(meth)acrylate, triethylene glycol di(meth)acrylate, tetraethylene glycol di(meth)acrylate, propylene glycol di(meth)acrylate, dipropylene glycol di(meth)acrylate, tripropylene glycol di(meth)acrylate, tetrapropylene glycol di(meth)acrylate, 1,4-butanediol di(meth)acrylate, 1,6-hexanediol di(meth)acrylate, neopentyl glycol di (meth)acrylate, 2,2'-bis[4-(meth)acryloyloxypropioxyphenyl]propane, 2,2'-bis[4-(meth)acryloyloxydiethoxydiphenyl]propane, glycerol tri(meth)acrylate, trimethylolpropane (meth)acrylate, pentaerythritol tetra(meth)acrylate, and the like.

Of these, divinylbenzene and ethylene glycol dimethacrylate are preferable.

When the cationic organic particles are formed of a copolymer of the cationic monomer and a monomer other than the cationic monomer, the cationic monomer as the raw material is preferably used in an amount of 0.1 to 60 mass %, and more preferably 0 1 to 20 mass % based on the total amount of the monomers.

The above-mentioned polymer may be produced by a known method using a radical polymerization initiator. Examples of the radical polymerization initiator include benzoyl peroxide, potassium persulfate, ammonium persulfate, 2,2'-azobisisobutyronitrile, and the like. The radical polymerization initiator is preferably used in an amount of 0.05 to 3.0 parts by mass, and more preferably 0.1 to 2.0 parts by mass based on 100 parts by mass of the total amount of the monomers.

A polymer having a cationic residue at its terminal may be produced using a polymerization initiator having a group that remains at the terminal of the polymer as a cationic residue (hereinafter may be referred to as "cationic polymerization initiator") when polymerizing the monomers. The cationic monomer may be copolymerized with a monomer having two or more polymerizable unsaturated bonds, if necessary.

The polymer may be produced by homopolymerization or copolymerization of at least one monomer selected from the cationic monomer and the monomer other than the cationic monomer. A polymer having a cationic residue in the side chain and at the terminal can be obtained using the cationic monomers as some or all of the raw material monomers.

Examples of the cationic polymerization initiator include 2,2'-azobis(2-methyl-N-phenylpropioneamidine)dihydrochloride (commercially available as "VA-545" from Wako Pure Chemical Industries, Ltd.), 2,2'-azobis[N-(4-chlorophenyl)-2-methylpropioneamidine]dihydrochloride (commercially available as "VA-546" from Wako Pure Chemical Industries, Ltd.), 2,2'-azobis[N-(4-hydroxyphenyl)-2-methylpropioneamidine]dihydrochloride (commercially available as "VA-548" from Wako Pure Chemical Industries, Ltd.), 2,2'-azobis[2-methyl-N-(phenylmethyl)-propioneamidine]dihydrochloride (commercially available as "VA-552" from Wako Pure Chemical Industries, Ltd.), 2,2'-azobis[2-methyl-N-(2-propenyl)-propioneamidine]dihydrochloride (commercially available as "VA-553" from Wako Pure Chemical Industries, Ltd.), 2,2'-azobis(2-methylpropioneamidine)dihydrochloride (commercially available as "V-50" from Wako Pure Chemical Industries, Ltd.), 2,2'-azobis[N-(2-hydroxyethyl)-2-methylpropioneamidine]dihydrochloride (commercially available as "VA-558" from Wako Pure Chemical Industries, Ltd.), 2,2'-azobis[N-(2-carboxyethyl)-2-methylpropioneamidine]hydrate (commercially available as "VA-057" from Wako Pure Chemical Industries, Ltd.), 2,2'-azobis[2-methyl-(5-methyl-2-imidazolin-2-yl)propane]dihydrochloride (commercially available as "VA-041" from Wako Pure Chemical Industries, Ltd.), 2,2'-azobis[2-(2-imidazolin-2-yl)propane]dihydrochloride (commercially available as "VA-044" from Wako Pure Chemical Industries, Ltd.), 2,2'-azobis[2-(4,5,6,7-tetrahydro-1H-1,3-diazepin-2-yl)propane]dihydrochloride (commercially available as "VA-054" from Wako Pure Chemical Industries, Ltd.), 2,2'-azobis[2-(3,4,5,6-tetrahydropyrimidin-2-yl)propane]dihydrochloride (commercially available as "VA-058" from Wako Pure Chemical Industries, Ltd.), 2,2'-azobis [2-(5-hydroxy-3,4,5,6-tetrahydropyrimidin-2-yl)propane]dihydrochloride (commercially available as "VA-059" from Wako Pure Chemical Industries, Ltd.), 2,2'-azobis{2-[1-(2-hydroxyethyl)-2-imidazolin-2-yl]propane} dihydrochloride (commercially available as "VA-060" from Wako Pure Chemical Industries, Ltd.), 2,2'-azobis[2-(2-imidazolin-2-yl) propane] (commercially available as "VA-061" from Wako Pure Chemical Industries, Ltd.), and the like.

Of these, 2,2'-azobis(2-methylpropioneamidine)dihydrochloride ("V-50"), 2,2'-azobis [N-(2-carboxyethyl)-2-methylpropioneamidine]hydrate ("VA-057"), or 2,2'-azobis[2-(2-imidazolin-2-yl)propane]dihydrochloride ("VA-044") is preferably used.

The cationic polymerization initiator is preferably used in an amount of 0.1 to 5.0 parts by mass, and more preferably 0.5 to 3.0 parts by mass based on 100 parts by mass of the total amount of the monomers.

When the cationic organic polymer particles are polymer particles to which a surfactant having a cationic residue adheres, the polymer preferably has a neutral or an anionic residue. Such a polymer may be produced by polymerizing the above-mentioned other monomers or the above-mentioned other monomers and the monomer having two or more polymerizable unsaturated bonds by a known method using the above-mentioned radical polymerization initiator (other than the cationic polymerization initiator).

As the monomer having an anionic residue, the above-mentioned vinyl carboxylate or the like may be used. The monomer having an anionic residue is preferably used in an amount of 1 to 60 mass %, and more preferably 1 to 30 mass % based on the total amount of the monomers.

In this case, the radical polymerization initiator is preferably used in an amount of 0.05 to 3.0 parts by mass, and more preferably 0.1 to 2.0 parts by mass based on 100 parts by mass of the total amount of the monomers.

Examples of the surfactant having a cationic residue include an alkyl pyridinyl chloride, alkylamine acetate, alkylammonium chloride, alkyneamine, and reactive cationic surfactants such as a diallylammonium halide disclosed in JP-A-60-235631, and the like.

The surfactant having a cationic residue is preferably used in an amount of 1 to 30 parts by mass, and more preferably 1 to 10 parts by mass based on 100 parts by mass of the polymer.

The surfactant having a cationic residue may be caused to adhere to the polymer using an appropriate method. For example, the surfactant having a cationic residue may be caused to adhere to the polymer by preparing a dispersion containing polymer particles and adding a surfactant solution to the dispersion.

The copolymer may be produced using a known polymerization method such as solution polymerization, emulsion polymerization, or suspension polymerization. The polymerization conditions (e.g., polymerization temperature and polymerization time) may be appropriately determined depending on the type of monomer to be copolymerized and the properties (e.g., molecular weight) of the copolymer.

The cationic organic polymer particles preferably have an average particle diameter of 1.0 micrometer or less, more preferably 0.02 to 0.6 micrometers, and particularly preferably 0.04 to 0.3 micrometers. The average particle diameter of the cationic organic polymer particles (D) is preferably 30% to 200%, more preferably 50% to 150%, and still more preferably 60% to 120% of the average particle diameter of the abrasive grains (A). The average particle diameter of the cationic organic polymer particles (D) may be measured using a dynamic light scattering method, a laser scattering diffraction method, transmission electron microscopy, or the like.

The content of the auxiliary particles (D) in the chemical mechanical polishing aqueous dispersion according to this embodiment is preferably 5 mass % or less, more preferably 3 mass % or less, and still more preferably 0.01 to 3 mass % based on 100 mass % of the chemical mechanical polishing aqueous dispersion. If the content of the auxiliary particles (D) is more than 5 mass % based on 100 mass % of the chemical mechanical polishing aqueous dispersion, efficient polishing may not be achieved due to a decrease in polishing rate.

The content of the auxiliary particles (D) in the chemical mechanical polishing aqueous dispersion according to this embodiment is preferably B 1 to 200 parts by mass, and more preferably 5 to 100 parts by mass based on 100 parts by mass of the abrasive grains (A).

1.5. pH Adjusting Agent (E)

The chemical mechanical polishing aqueous dispersion according to this embodiment may include the PH adjusting agent (E).

The pH adjusting agent (E) may be an acid or a base, for example. The chemical mechanical polishing aqueous dispersion can be stabilized and the dispersibility, the polishing speed, and the selectivity of the abrasive grains (A) can be improved by adjusting the pH of the chemical mechanical polishing aqueous dispersion using the pH adjusting agent (E) corresponding to the material for the abrasive grains (A).

The acid which may be used as the pH adjusting agent (E) is not particularly 5 limited. An organic acid and an inorganic acid may be used.

Examples of the organic acid include p-toluenesulfonic acid, isoprenesulfonic acid, gluconic acid, lactic acid, citric acid, tartaric acid, malic acid, glycolic acid, malonic acid, formic acid, oxalic acid, succinic acid, fumaric acid, maleic acid, phthalic acid, and the like.

Examples of the inorganic acid include nitric acid, hydrochloric acid, sulfuric acid, and the like.

These organic acids and inorganic acids may be respectively used either individually or in combination of two or more. The organic acid and the inorganic acid may be used in combination.

The base used as the pH adjusting agent (E) is not particularly limited. An organic base and an inorganic base may be used.

Examples of the organic base include nitrogen-containing organic compounds (e.g., ethylenediamine, trimethylamine, tetramethylamine hydroxide, and ethanolamine) and the like.

Examples of the inorganic base include ammonia, potassium hydroxide, sodium hydroxide, lithium hydroxide, and the like.

These bases used as the pH adjusting agent (E) may be used either individually or in combination of two or more. The organic base and the inorganic base may be used in combination.

The pH adjusting agent (E) is used in such an amount that the pH of the chemical mechanical polishing aqueous dispersion according to this embodiment is preferably adjusted to 3.0 or more and 13.0 or less, more preferably 4.0 or more and 10.0 or less, and most preferably 5.0 or more and 9.0 or less.

1.6. Surfactant (F)

Examples of the surfactant include a cationic surfactant, an anionic surfactant, and a nonionic surfactant.

Examples of the cationic surfactant include an aliphatic amine salt, an aliphatic ammonium salt, and the like.

Examples of the anionic surfactant include a carboxylate, a sulfonate, a sulfate salt, a phosphate salt, and the like. Examples of the carboxylate include fatty acid soap, an alkyl ether carboxylate, and the like. Examples of the sulfonate include an alkylbenzenesulfonate, an alkylnaphthalenesulfonate, an alpha-olefin sulfonate, and the like. Examples of the sulfate salt include a higher alcohol sulfate salt, an alkyl ether sulfate, and the like. Examples of the phosphate salt include an alkyl phosphate salt and the like.

Examples of a counter cation of the anionic surfactant include an ammonium ion, an alkylammonium ion, a potassium ion, and the like.

Of these, a salt of dodecylbenzenesulfonic acid or a salt of an alkyl diphenyl ether disulfonic acid is preferable. An ammonium salt of dodecylbenzenesulfonic acid or an ammonium salt of an alkyl diphenyl ether disulfonic acid is more preferable.

Examples of the nonionic surfactant include an ether-type surfactant, an ether ester-type surfactant, an ester-type surfactant, an acetylene-type surfactant, and the like.

Examples of the ether-type surfactant include a polyoxyethylene alkyl ether and the like. Examples of the ether ester-type surfactant include a polyoxyethylene ether of a glycerol ester and the like. Examples of the ester-type surfactant include a polyethylene glycol fatty acid ester, a glycerol ester, a sorbitan fatty acid ester, and the like. Examples of the reactive surfactant include Adeka Reasoap ER-30 and Adeka Reasoap ER-10 manufactured by Adeka Corporation, Latemul PD-420 and Latemul PD-450 manufactured by Kao Corporation, and the like.

These surfactants may be used either individually or in combination of two or more.

1.7. Preservative (G)

The chemical mechanical polishing aqueous dispersion according to this embodiment may include the preservative (G). Decay of the chemical mechanical polishing aqueous dispersion can be prevented by adding the preservative (G) so that a stable chemical mechanical polishing aqueous dispersion can be obtained. A bromonitroalcohol compound or an isothiazolone compound may be used as the preservative (G). Examples of the bromonitroalcohol compound include 2-bromo-2-nitro-1,3-propanediol, 2-bromo-2-nitro-1,3-butanediol, 2,2-dibromo-2-nitroethanol, and 2,2-dibromo-3-nitrilopropionamide. Examples of the isothiazolone compound include 1,2-benzoisothiazol-3-one, 5-chloro-2-methyl-4-isothiazol-3-one, 2-methyl-4-isothiazol-3-one, 5-chloro-2-phenethyl-3-isothiazolone, 4-bromo-2-n-dodecyl-3-isothiazolone, 4,5-dichloro-2-n-octyl-3-isothiazolone, 4-methyl-5-chloro-2-(4'-chlorobenzyl)-3-isothiazolone, 4,5-dichloro-2-(4'-chlorobenzyl)-3-isothiazolone, 4,5-dichloro-2-(4'-chlorophenyl)-3-isothiazolone, 4,5-dichloro-2-(2'-methoxy-3'-chlorophenyl)-3-isothiazolone, 4,5-dibromo-2-(4'-chlorobenzyl)-3-isothiazolone, 4-methyl-5-chloro-2-(4'-hydroxyphenyl)-3-isothiazolone, 4,5-dichloro-2-n-hexyl-3-isothiazolone, 5-chloro-2-(3',4'-dichlorophenyl)-3-isothiazolone, and the like. Of these, 2-bromo-2-nitro-1,3-propanediol, 1,2-benzoisothiazol-3-one, 5-chloro-2-methyl-4-isothiazol-3-one, and 2-methyl-4-isothiazol-3-one are preferable. The preservative is preferably used in a neutral region (pH: 5 to 9). The content of the preservative (G) is preferably 0.0002 to 0.2 mass %, more preferably 0.001 to 0.17 mass %, and particularly preferably 0.002 to 0.15 mass % based on 100 mass % of the total amount of the chemical mechanical polishing aqueous dispersion. A stable preservative performance can be obtained by adding the preservative (G) within this range.

The chemical mechanical polishing aqueous dispersion according to this embodiment may be produced by mixing at least one component selected from (B) a dispersion medium, (C) a water-soluble polymer, (D) auxiliary particles, (E) a pH adjusting agent, (F) a surfactant, and (G) a preservative with the chemical mechanical polishing aqueous dispersion according to this embodiment. The dispersion medium (B), the water-soluble polymer (C), the auxiliary particles (D), the pH adjusting agent (E), the surfactant (F), and the preservative (G) are similar to those mentioned above.

In this case, the chemical mechanical polishing aqueous dispersion according to this embodiment may be produced using a kit for producing a chemical mechanical polishing aqueous dispersion by mixing a first liquid and a second liquid.

The kit may include the first liquid and the second liquid. The first liquid of the kit may be a chemical mechanical polishing aqueous dispersion comprising at least the abrasive grains (A) and the dispersion medium (B), and the second liquid of the kit include one or more components selected from the dispersion medium (B), the water-soluble polymer (C), the auxiliary particles (D), and the pH adjusting agent (E). The first liquid may further include one or more components selected from the water-soluble polymer (C), the auxiliary particles (D), the pH adjusting agent (E), the surfactant (F), and the preservative (G).

One or more components selected from the dispersion medium (B), the water-soluble polymer (C), the auxiliary particles (D), the pH adjusting agent (E), and the preservative (G) are preferably in a fluid state. The term "fluid state" refers to a liquid state or a state in which a solid is dispersed in a liquid.

The chemical mechanical polishing aqueous dispersion according to this embodiment may contain each component in the above-mentioned amount. The chemical mechanical polishing aqueous dispersion according to this embodiment may be stored or transported in a concentrated state. The concentrated chemical mechanical polishing aqueous dispersion according to this embodiment may be used after adjusting the content of each component within the above-mentioned range by diluting the chemical mechanical polishing aqueous dispersion when using the chemical mechanical polishing aqueous dispersion for chemical mechanical polishing.

When storing or transporting the chemical mechanical polishing aqueous dispersion according to this embodiment, it is preferable that the content of the abrasive grains (A) be not more than 40 mass % of the total amount of the chemical mechanical polishing aqueous dispersion. The chemical mechanical polishing aqueous dispersion according to this embodiment can be stably stored for a long period of time by preparing the chemical mechanical polishing aqueous dispersion according to this embodiment so that the content of the abrasive grains (A) is within the above-mentioned range.

The chemical mechanical polishing aqueous dispersion according to this embodiment may be suitably used as a chemical mechanical polishing aqueous dispersion for planarizing a conductive layer or an insulating layer in the production of semiconductor devices, for example.

2. Method of Producing Chemical Mechanical Polishing Aqueous Dispersion

A chemical mechanical polishing aqueous dispersion according to one embodiment of the invention is produced by adding the abrasive grains (A), the auxiliary particles (D), and the water-soluble polymer (C) to the dispersion medium (B) and stirring the mixture. The auxiliary particles (D) are used in an amount of 5 to 100 parts by mass (preferably 10 to 80 parts by mass, and more preferably 15 to 60 parts by mass) based on 100 parts by mass of the abrasive grains (A), and the water-soluble polymer (C) is used in an amount of 5 to 100 parts by mass (preferably 10 to 80 parts by mass, and more preferably 15 to 60 parts by mass) based on 100 parts by mass of the abrasive grains (A). In this case, the abrasive grains (A) are preferably inorganic particles containing ceria, the auxiliary particles (D) are preferably cationic organic polymer particles, and the water-soluble polymer (C) is preferably an anionic water-soluble polymer. It is more preferable that the abrasive grains (A) be ceria.

The abrasive grains (A) and the water-soluble polymer (C) may be added to the medium in an appropriate order. It is preferable to provide a dispersion in which the abrasive grains (A) are dispersed to a specific concentration, and add the auxiliary particles (D) and the water-soluble polymer (C) to the dispersion in an arbitrary order while stirring the dispersion.

The above-mentioned dispersion medium may be used as the dispersion medium (B) which may be used to produce the chemical mechanical polishing aqueous dispersion according to this embodiment.

The pH of the chemical mechanical polishing aqueous dispersion according to this embodiment during production is preferably 3.0 to 10.0, and more preferably 3.5 to 9.0.

The pH of the chemical mechanical polishing aqueous dispersion according to this embodiment may be adjusted by adding an acid or a base described later as an optional component.

The content of inorganic particles in the dispersion of the abrasive grains (A) during production of the chemical mechanical polishing aqueous dispersion according to this embodiment is preferably 1 to 40 mass %, more preferably 3 to 20 mass %, and still more preferably 5 to 15 mass %.

The cationic organic polymer particles are preferably added in the form of a dispersion having a specific concentration. The content of the cationic organic polymer particles in the dispersion of the cationic organic polymer particles (D) is preferably 5 to 25 mass %, and more preferably 10 to 20 mass %.

The anionic water-soluble polymer is preferably added in the form of a solution. The concentration of the solution is preferably 5 to 40 mass %, and more preferably 10 to 30 mass %.

It is preferable that the chemical mechanical polishing aqueous dispersion according to this embodiment be stirred during production at as high a stirring speed as possible. The inorganic particles precipitate if the chemical mechanical polishing aqueous dispersion is not stirred during production, whereby the abrasive grains (A), the auxiliary particles (D), and the water-soluble polymer (C) may not be dispersed uniformly. The stirring speed is not particularly limited insofar as the abrasive grains (A) do not precipitate. It is preferable that the outermost circumferential speed of a stirring blade be 1 m/sec or more.

The chemical mechanical polishing aqueous dispersion according to this embodiment thus produced enables high-speed polishing substantially without causing scratches on a polishing target surface, as is clear from the examples described later, and is very suitable for polishing an insulating layer in a shallow trench isolation step (STI step) or for polishing an interlayer dielectric of a multi-layered wiring board.

In the chemical mechanical polishing aqueous dispersion according to this embodiment, the inorganic particles containing ceria (abrasive grains (A)) and the cationic organic polymer particles (auxiliary particles (D)) are combined through the anionic water-soluble polymer (water-soluble polymer (C)) to form specific aggregates. This was confirmed by electron microscope observation. In order to form such an aggregate, it is preferable that the dispersion contain each component in the above-mentioned ratio, and that the average particle diameter of the cationic organic polymer particles (D) be 30% to 200%, more preferably 50% to 150%, and still more preferably 60% to 120% of the average particle diameter of the abrasive grains (A).

Specifically, since the chemical mechanical polishing aqueous dispersion according to this embodiment contains specific amounts of the water-soluble polymer (C) (anionic water-soluble polymer) and the auxiliary particles (D) (cationic organic polymer particles) with respect to the abrasive grains (A) (inorganic particles containing ceria), the inorganic particles and the cationic organic polymer particles of which the surface is positively charged are bonded through the anionic water-soluble polymer of which the surface is negatively charged to form specific aggregates. This is considered to be the reason why the chemical mechanical polishing aqueous dispersion according to this embodiment enables high-speed polishing substantially without causing scratches on a polishing target surface. It is preferable that the water-soluble polymer (C) be added in an amount of 5 to 100 parts by mass based on 100 parts by mass of the abrasive grains (A). If the water-soluble polymer (C) is added in an amount of less than 5 parts by mass based on 100 parts by mass of the abrasive grains (A), the stability of the chemical mechanical polishing aqueous dispersion may be poor. If the water-soluble polymer (C) is added in an amount of more than 100 parts by mass based on 100 parts by mass of the abrasive grains (A), the aggregates may become too large, whereby the aggregates may be filtered off.

3. Chemical Mechanical Polishing Method

A chemical mechanical polishing method according to one embodiment of the invention includes polishing and planarizing a conductive layer or an insulating layer in the production of semiconductor devices using the chemical mechanical polishing aqueous dispersion according to the above embodiment.

A chemical mechanical polishing method according to one embodiment of the invention includes polishing and planarizing a conductive layer or an insulating layer in the production of semiconductor devices using a dispersion obtained by mixing the chemical mechanical polishing aqueous dispersion according to the above embodiment and at least one component selected from the dispersion medium (B), the water-soluble polymer (C), the auxiliary particles (D), the pH adjusting agent (E), the surfactant (F), and the preservative (G). The chemical mechanical polishing aqueous dispersion according to this embodiment used for the chemical mechanical polishing method includes at least the abrasive grains (A) having a pore volume of 0.14 ml/g or more and the dispersion medium (B), and may further include at least one component selected from the water-soluble polymer (C), the auxiliary particles (D), the pH adjusting agent (E), the surfactant (F), and the preservative (G). The chemical mechanical polishing aqueous dispersion may include 100 parts by mass of inorganic particles containing ceria as the abrasive grains (A), 5 to 100 parts by mass of an anionic water-soluble polymer as the water-soluble polymer (C), and 5 to 100 parts by mass of cationic organic polymer particles as the auxiliary particles (D), for example.

The conductive layer polished using the chemical mechanical polishing method may be a wiring conductive material or a barrier metal material such as Cu, Al, W, Sn, Mg, Mo, Ru, Ag, Au, Ti, Ta, TaN, TiAlN, TiN, or the like.

The insulating layer polished using the chemical mechanical polishing method may be a silicon oxide film ($SiO_2$ film), a borophosphosilicate glass (BPSG) film produced by adding small amounts of boron and phosphorus to $SiO_2$, an insulating film referred to as fluorine-doped silicate glass (FSG) produced by doping $SiO_2$ with fluorine, a low-dielectric-constant insulating layer, a silicon nitride film (SiN film), a silicon oxynitride film (SiON film), or the like.

Examples of the silicon oxide film include a thermal oxide film, a plasma enhanced-TEOS (PETEOS) film, a high-density plasma enhanced-TEOS film (HDPTEOS film), a silicon oxide film produced by thermal CVD, and the like.

The borophosphosilicate glass (BPSG) film may be produced by atmospheric-pressure CVD (AP-CVD) or low-pressure CVD (LP-CVD).

The FSG insulating film may be produced by chemical vapor deposition utilizing high-density plasma as an accelerating condition, for example.

Examples of the low-dielectric-constant insulating layer include a silicon oxide insulating layer and an organic polymer insulating layer.

A low-dielectric-constant silicon oxide insulating film may be produced using a method of applying a raw material to a substrate by spin coating and heating the raw material in an oxidizing atmosphere, a CVD method which supplies and deposits a raw material under vacuum, or the like. Examples of such a low-dielectric-constant silicon oxide insulating film include a hydrogen silsesquioxane (HSQ) film using triethoxysilane as the raw material, a methylsilsesquioxane (MSQ) film using tetraethoxysilane and a small amount of methyltrimethoxysilane as the raw materials, and low-dielectric-constant insulating films using other silane compounds as the raw materials. The dielectric constant of the low-dielectric-constant insulating film may be reduced by mixing appropriate organic polymer particles with the raw material so that the polymer is burnt out during heating to form holes. A low-dielectric-constant insulating film may also produced using an organic polymer (e.g., polyarylene polymer, polyarylene ether polymer, polyimide polymer, or benzocyclobutene polymer) as the raw material. These low-dielectric-constant insulating layers are commercially available as JSR-LKD manufactured by JSR Corporation, Black Diamond manufactured by Applied Materials, Coral manufactured by Novellus Systems, SiLK manufactured by Dow Chemical, and the like.

The thermal oxide film may be produced by exposing high-temperature silicon to an oxidizing atmosphere to cause silicon to chemically react with oxygen or moisture.

The PETEOS film may be produced by chemical vapor deposition of tetraethylorthosilicate (TEOS) as the raw material utilizing plasma as an accelerating condition, for example.

The HDP film may be produced by chemical vapor deposition of tetraethylorthosilicate (TEOS) as the raw material utilizing high-density plasma as an accelerating condition, for example.

The silicon oxide film obtained by thermal CVD may be produced by atmospheric-pressure CVD (AP-CVD) or low-pressure CVD (LP-CVD), for example.

A wafer having a structure shown in FIG. 2 described later is an example of a polishing target having such an insulating layer.

The chemical mechanical polishing method according to this embodiment may be carried out under known polishing conditions using a chemical mechanical polishing system such as EPO-112 or EPO-222 manufactured by Ebara Corporation, A-FP-210A manufactured by Tokyo Seimitsu Co., Ltd., Mirra manufactured by Applied Materials, XCEDA manufactured by Novellus Systems, or NPS3301 manufactured by Nikon Corporation.

The chemical mechanical polishing method according to this embodiment is described in detail below with reference to FIGS. 1 and 2. Note that the chemical mechanical polishing method according to this embodiment is not limited to the following method. FIG. 1 is a schematic view showing an example of the chemical mechanical polishing method according to this embodiment. FIG. 2 is a cross-sectional view schematically showing an example of a polishing target 4 (e.g., semiconductor wafer). FIG. 3 is a cross-sectional view schematically showing the polishing target 4 after polishing.

Figure 2:
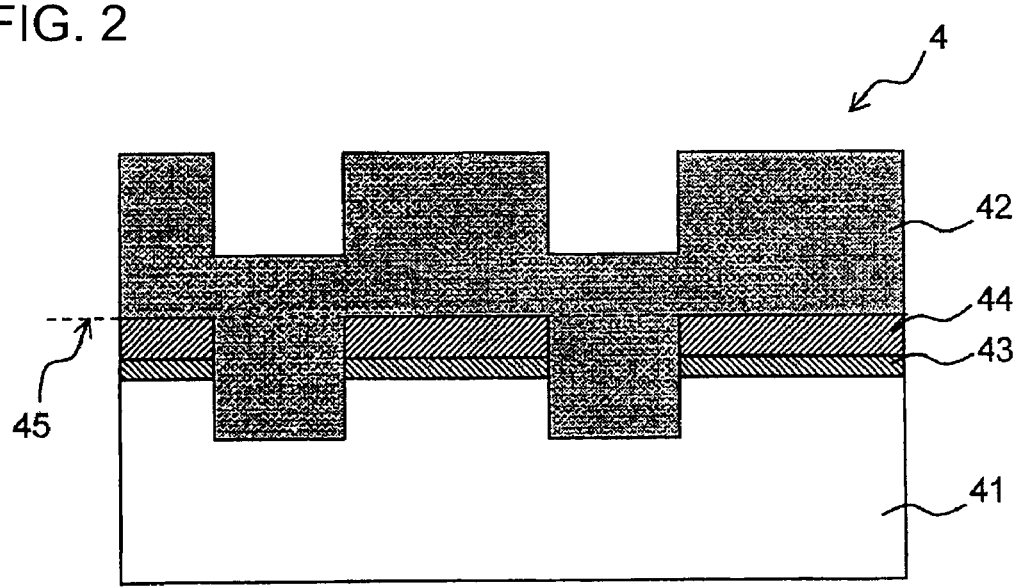
FIG. 2 is a cross-sectional view schematically showing an example of a polishing target (e.g., semiconductor wafer).
Figure 3:
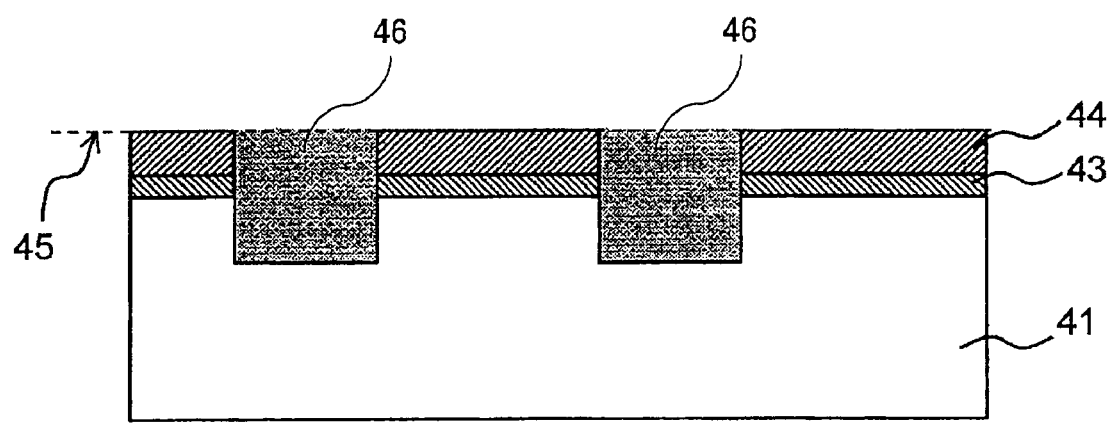
FIG. 3 is a cross-sectional view schematically showing a polishing target after polishing.

FIG. 2 shows an example in which a polishing target material 42 of the polishing target 4 is an insulating layer. Note that the polishing target of the chemical mechanical polishing method according to this embodiment is not limited to an insulating layer, but may be a conductive layer.

FIGS. 2 and 3 show a step of forming a trench isolation region 46 (see FIG. 3) in a semiconductor substrate 41. Specifically, an insulating layer 43 and a stopper layer 44 are stacked on the semiconductor substrate 41 of the polishing target 4 (semiconductor wafer) shown in FIG. 2. A groove 43 is then formed, and an insulating layer 42 is formed on the semiconductor substrate 41 so that the groove 43 is filled therewith. The insulating layer 42 shown in FIG. 2 is polished using the device shown in FIG. 1 to form the trench isolation region 46 in the semiconductor substrate 41, as shown in FIG. 3. The details of the chemical mechanical polishing method according to this embodiment are given below.

As shown in FIG. 1, a polishing pad 1 is secured to a platen 2 which rotates axially. The polishing target 4 is attached to one end of a head 3. The head 3 rotates and moves while pressing the polishing target 4 against the surface of the polishing pad 1 so that the polishing target 4 slidingly moves over the surface of the polishing pad 1.

The polishing target 4 is caused to slidingly move over the surface of the polishing pad 1 while supplying a chemical mechanical polishing aqueous dispersion 6 according to this embodiment onto the surface of the polishing pad 1, whereby the polishing target material 42 (insulating layer) of the polishing target 4 (see FIG. 2) is removed. The trench isolation region 46 is thus formed in the semiconductor substrate 41 (see FIG. 3).

As shown in FIG. 1, the chemical mechanical polishing aqueous dispersion 6 according to this embodiment may be supplied from an aqueous dispersion supply section 5 placed above the polishing pad 1, for example.

As the polishing pad, a known polishing pad such as IC1000/SUBA400, IC1010, SUBA, Polytex (manufactured by Rodel Nitta), or the like may be used. The polishing pad may be replaced with another polishing pad during polishing.

3. EXAMPLE

The invention is described in more detail below by way of examples. Note that the invention is not limited to the following examples.

3-1. Example 1

3-1-1. Preparation of Ceria Aqueous Dispersion

Cerium carbonate was fired at 750° C. for four hours, mixed with ion-exchanged water, and ground in a bead mill using zirconia beads to disperse for 72 hours. A supernatant liquid corresponding to 90 mass % was batched off from the resulting ceria aqueous dispersion to obtain a ceria aqueous dispersion containing 35.8 mass % of ceria.

The ceria content of the resulting aqueous dispersion (ceria content: 35.8 mass %) was adjusted to 5 mass % by adding ion-exchanged water to prepare a 5 mass % ceria aqueous dispersion. The pH of the resulting ceria aqueous dispersion was 5.3.

3-1-2. Measurement of Pore Volume and BET Specific Surface Area

After drying the ceria aqueous dispersion obtained in 3-1-1., 0.3 g of the dried product was sampled. The adsorption isotherm of the sample was measured by a gas adsorption BET multipoint method using an Autosorb-1 AS1MP-LP manufactured by Quantachrome. As preconditioning, air was removed at 300° C. for one hour at a degree of vacuum of 0.665×10$^{-5}$ Pa or less. The measurement was then conducted under conditions of a relative pressure range of 0.00002 to 0.999, a saturation vapor pressure of 204 mmHg, and a degree of vacuum of 0.665×10$^{-5}$ Pa or less using Ar as an adsorption gas and He as a purge gas (adsorption side: 42 points, desorption side: 10 points). The resulting data was analyzed by the Barrett-Joyner-Halenda (BJH) method. The pore volume was 0.16 ml/g, and the specific surface area calculated by the BET method was 34 cm$^2$/g.

3-1-3. Measurement of D99 Value

The D99 value of the ceria aqueous dispersion obtained in 3-1-1. was measured by laser diffractometry using a particle size distribution measurement device "LA-920" (manufactured by Horiba, Ltd.). The average particle diameter was 182 nm, and the D99 value was 0.7 micrometers.

3-1-4. Chemical Mechanical Polishing

Chemical mechanical polishing was carried out under the following conditions.

Polishing conditions

Polishing system: "EPO-112" manufactured by Ebara Corporation
Polishing pad: "IC1000/SUBA400" manufactured by Rodel Nitta
Platen rotational speed: 100 rpm
Polishing head rotational speed: 107 rpm
Polishing head pressure: 350 hPa
Polishing aqueous dispersion supply rate: 200 ml/min
Polishing time: 1 minute 3-1-5. Polishing Rate Evaluation Method 3-1-5-1. Preparation of Polishing Rate Evaluation Chemical Mechanical Polishing Aqueous Dispersion Ion-exchanged water was added to the 5 mass % ceria aqueous dispersion obtained in 3-1-1. to prepare a chemical mechanical polishing aqueous dispersion containing 0.5 mass % of ceria.

3-1-5-2. Evaluation of Chemical Mechanical Polishing Rate

An eight-inch silicon wafer on which a thermal oxide film was deposited as an insulating layer was subjected to chemical mechanical polishing under the conditions described in 3-1-4 using the chemical mechanical polishing aqueous dispersion obtained in 3-1-5-1. The thickness of the polishing target material was measured before and after polishing using an spectroscopic film thickness meter "NanoSpec 6100" (manufactured by Nanometrics Japan Ltd.). The polishing rate was calculated from the thickness reduced by chemical mechanical polishing and the polishing time. The polishing rate thus calculated was 500 nm/min. Occurrence of scratches was not observed.

A polishing rate of more than 400 nm/min was evaluated as excellent, a polishing rate of 200 to 400 nm/min was evaluated as good, and a polishing rate of less than 200 nm/min was evaluated as poor.

3-1-6. Scratch Evaluation Method 3-1-6-1. Preparation of Scratch Evaluation Chemical Mechanical Polishing Aqueous Dispersion The 5 mass % ceria aqueous dispersion obtained in 3-1-1 was diluted with ion-exchanged water so that the ceria content became 0.5 mass %. An aqueous solution (concentration: 30 mass %) of an anionic water-soluble polymer (ammonium polyacrylate having a weight average molecular weight of 10,000) was then added to the chemical mechanical polishing aqueous dispersion. The amount of the anionic water-soluble high polymer was adjusted so that the polishing rate was 18 to 20 nm/min according to the method described in 3-1-5 to prepare a chemical mechanical polishing aqueous dispersion.

3-1-6-2. Scratch Evaluation

An eight-inch silicon wafer on which a thermal oxide film was deposited as an insulating layer was polished under the conditions described in 3-1-4 using the chemical mechanical polishing aqueous dispersion obtained in 3-1-6-1. The polished thermal oxide film was inspected in terms of defects using a wafer defect inspection instrument "KLA2351" (manufactured by KLA-Tencor Corporation). The number of defects determined by the wafer defect inspection instrument was counted over the entire surface of the wafer under conditions of a pixel size of 0.39 micrometers and a threshold of 20. Whether or not each defect was a scratch or foreign matter adhering to the surface of the wafer was determined to determine the number of scratches over the entire surface of the wafer. Foreign matter adhering to the surface of the wafer, a stain produced during wafer production, or the like may be determined to be a defect by the wafer defect inspection instrument. The number of defects was 193, and the number of scratches was 19.

A case where the number of scratches was 50 or less per surface was evaluated as excellent, a case where the number of scratches was 51 to 100 per surface was evaluated as good, and a case where the number of scratches was 101 or more per surface was evaluated as poor.

3-2. Examples 2 to 8 and Comparative Examples 1 to 4

Evaluations were carried out in the same manner as in Example 1 except for using an aqueous dispersion of ceria having the pore volume shown in Table 1. Table 1 shows the preparation condition for the chemical mechanical polishing aqueous dispersion, the pore volume, the BET specific surface area, and the D99 value of the abrasive grains (A), the polishing rate, the number of defects, and the number of scratches together with the results of Example 1.

TABLE 1

| | Abrasive grains (A) | | | Polishing rate when using only abrasive grains | Auxiliary particles (D) | | Number of | Number of |
| --- | --- | --- | --- | --- | --- | --- | --- | --- |
| | Pore volume | BET specific surface area | D99 | (A) | | Amount | defects | scratches |
| Unit | ml/g | m$^2$/g | micrometer | nm/min | Type | (mass %) | per wafer | per wafer |
| Example 1 | 0.16 | 34 | 0.7 | 500 | — | — | 193 | 19 |
| Example 2 | 0.14 | 35 | 0.9 | 530 | — | — | 405 | 73 |
| Example 3 | 0.18 | 32 | 0.5 | 470 | — | — | 55 | 9 |
| Example 4 | 0.28 | 40 | 0.3 | 310 | — | — | 15 | 3 |
| Example 5 | 0.17 | 28 | 0.6 | 450 | — | — | 49 | 17 |
| Example 6 | 0.20 | 31 | 0.4 | 430 | — | — | 39 | 12 |
| Example 7 | 0.23 | 37 | 0.6 | 400 | — | — | 169 | 5 |

TABLE 1-continued

| | Abrasive grains (A) | | | | Auxiliary particles (D) | | Number of | Number of |
|---|---|---|---|---|---|---|---|---|
| Unit | Pore volume ml/g | BET specific surface area $m^2/g$ | D99 micrometer | Polishing rate when using only abrasive grains (A) nm/min | Type | Amount (mass %) | defects per wafer | scratches per wafer |
| Example 8 | 0.14 | 29 | 0.7 | 580 | — | — | 228 | 65 |
| Example 9 | 0.16 | 34 | 0.7 | 500 | (a) | 1.0 | 157 | 17 |
| Example 10 | 0.14 | 35 | 0.9 | 530 | (b) | 0.5 | 276 | 53 |
| Example 11 | 0.16 | 34 | 0.7 | 500 | (c) | 3.0 | 28 | 0 |
| Comparative Example 1 | 0.12 | 18 | 2.9 | 600 | — | — | 1069 | 106 |
| Comparative Example 2 | 0.07 | 10 | 1.3 | 620 | — | — | 2494 | 497 |
| Comparative Example 3 | 0.13 | 27 | 1.0 | 570 | — | — | 5508 | 1723 |
| Comparative Example 4 | 0.08 | 23 | x | x | — | — | X | X |
| Comparative Example 5 | 0.07 | 10 | 1.3 | 620 | (a) | 1.0 | 1733 | 384 |
| Comparative Example 6 | 0.12 | 18 | 2.9 | 600 | (b) | 0.5 | 836 | 96 |
| Comparative Example 7 | 0.07 | 10 | 1.3 | 620 | (c) | 3.0 | 893 | 153 |
| Reference Example 1 | 0.18 | 32 | 0.5 | 470 | (d) | 0.5 | 2813 | 694 |
| Reference Example 2 | 0.16 | 34 | 0.7 | 500 | (a) | 0.5 | X | X |
| Reference Example 3 | 0.16 | 34 | 0.7 | 500 | (a) | 0.5 | XX | XX |

In Table 1, the symbol "X" indicates that the evaluation was impossible due to precipitation of the abrasive grains, and the symbol "XX" indicates that the evaluation was impossible because the polishing rate of the chemical mechanical polishing aqueous dispersion decreased to a large extent.

As shown in Table 1, the polishing rate was excellent and the number of scratches was small when polishing an insulating layer using the chemical mechanical polishing aqueous dispersions of Examples 1 to 8. It was confirmed that the chemical mechanical polishing aqueous dispersions of Examples 1 to 8 had an excellent performance as a chemical mechanical polishing aqueous dispersion used when removing unnecessary insulating layer during formation of a shallow trench isolation region.

As is clear from the results of Comparative Examples 1 to 4, the number of scratches was large when the pore volume of the abrasive grains was less than 0.14 ml/g, although the polishing rate was excellent. Therefore, the aqueous dispersions of Comparative Examples 1 to 4 are not suitable as a chemical mechanical polishing aqueous dispersion.

3-3. Example 9 and Comparative Example 5
3-3-1. Preparation of Auxiliary Particles (D) (Organic Polymer Particles)
3-3-1-1. Synthesis Example 1 (Preparation of Cationic Organic Polymer Particles (A))

60 parts by mass of methyl methacrylate and 40 parts by mass of styrene as monomers, 1.0 part by mass of 2,2'-azobis (2-methyl-N-phenylpropioneamidine)dihydrochloride ("VA-545" manufactured by Wako Pure Chemical Industries, Ltd.) as a polymerization initiator, 1.0 part by mass of a cationic surfactant "Quartamin 24P" (manufactured by Kao Corporation) and 1.0 part by mass of a nonionic surfactant "Emulgen 147" (manufactured by Kao Corporation) as surfactants, and 400 parts by mass of ion-exchanged water were mixed. The mixture was heated to 70° C. with stirring in a nitrogen gas atmosphere, and polymerized at 70° C. for five hours to obtain an aqueous dispersion containing 19 mass % of cationic organic polymer particles (a).

The average particle diameter of the organic particles (a) measured by laser diffractometry was 167 nm, and the zeta potential of the organic polymer particles (a) was +27 mV
3-3-1-2. Synthesis Example 2,3,4 (Preparation of Cationic Organic Polymer Particles (B) and (C)) and Synthesis Example 5 (Preparation of Anionic Organic Polymer Particles (D))

The same process as in Synthesis Example 1 was carried out except for changing the types and the amounts of the monomer, the polymerization initiator, and the surfactant as shown in Table 2 to obtain aqueous dispersions respectively containing cationic organic polymer particles (b) and (c) and anionic organic polymer particles (d). Table 2 shows the average particle diameter and the zeta potential of the organic polymer particles obtained in each synthesis example.

TABLE 2

| Auxiliary particles (D) | Synthesis Example 1 (a) | Synthesis Example 3 (b) | Synthesis Example 4 (c) | Synthesis Example 5 (d) |
|---|---|---|---|---|
| Monomer (part by mass) | | | | |
| Methyl methacrylate | 60 | 40 | 60 | 60 |
| Styrene | 40 | 50 | 38 | 28 |
| Acrylonitrile | — | 7 | — | — |
| Divinylbenzene | — | 3 | — | 10 |
| Methyl methacrylamide | — | — | 2 | — |
| Methacrylic acid | — | — | — | 2 |
| Polymerization initiator (part by mass) | | | | |
| V-545 | 1.0 | 0.5 | — | — |
| V-50 | — | — | 05 | — |
| Ammonium persulfate | — | — | — | 0.5 |
| Surfactant (parts by mass) | | | | |
| Quartamin 24P | 1 | 0.5 | 1.5 | — |
| Emulgen 147 | 1 | — | — | 0.5 |
| ER-30 | — | 1 | — | — |
| PD-420 | — | — | 1 | — |
| DBSA | — | — | — | 2 |
| Physical properties | | | | |
| Average particle diameter (nm) | 167 | 217 | 102 | 145 |
| Zeta potential (mV) | +27 | +19 | +22 | −32 |

The abbreviations and the like shown in Table 2 have following meanings. Polymerization initiator
V-545: 2,2'-azobis(2-methyl-N-phenylpropioneamidine)dihydrochloride manufactured by Wako Pure Chemical Industries, Ltd.
V-50: 2,2'-azobis(2-methylpropioneamidine)dihydrochloride manufactured by Wako Pure Chemical Industries, Ltd.

Surfactant

Quartamin 24P: 27% solution of lauryltrimethylammonium chloride (cationic surfactant) manufactured by Kao Corporation Emulgen 147: polyoxyethylene lauryl ether (nonionic surfactant) manufactured by Kao Corporation ER-30: "Adeka Reasoap ER-30" (nonionic reactive surfactant) manufactured by Adeka Corporation PD-420: "Latemul PD-420" (nonionic reactive surfactant) manufactured by Kao Corporation DBSA: ammonium dodecylbenzenesulfonate (anionic surfactant)

The numerals corresponding to each component in Table 1 indicate the amount (part by mass) of that component added for polymerization. The symbol "-" indicates that the corresponding component was not added.

3-3-2. Preparation of Chemical Mechanical Polishing Aqueous Dispersion X

An aqueous dispersion of ceria prepared as the abrasive grains (A) as described above was added to ion-exchanged water placed in a container so that the ceria content in the concentrate of the chemical mechanical polishing aqueous dispersion was 5 mass %. An aqueous dispersion containing the cationic organic polymer particles (a) as the auxiliary particles (D) was added to the mixture so that the content of the organic polymer particles (a) in the concentrate of the chemical mechanical polishing aqueous dispersion was 1.0 mass %. The mixture was stirred for 30 minutes. An aqueous solution containing 5 mass % of an anionic water-soluble high polymer (ammonium polyacrylate having an Mw of 10,000) as the water-soluble polymer (C) was added to the mixture with stirring so that the ammonium polyacrylate content in the concentrate of the chemical mechanical polishing aqueous dispersion was 2.0 mass %. The mixture was then stirred for 30 minutes. The mixture was filtered through a polypropylene depth filter having a pore diameter of 5 micrometers to obtain a chemical mechanical polishing aqueous dispersion X containing 5 mass % of the abrasive grains (A) (ceria).

The concentrate X was subjected to the chemical mechanical polishing test described in 3-1-6 in the same manner as in Example 1.

A concentrate of a chemical mechanical polishing aqueous dispersion of Comparative Example 5 shown in Table 3 was obtained in the same manner as in Example 9 except for using an aqueous dispersion containing ceria having properties shown in Table 1 as the abrasive grains (A). The concentrate was subjected to the chemical mechanical polishing test described in 3-1-6 in the same manner as in Example 1.

3-4. Examples 10 and 11 and Comparative Examples 6 and 7

A concentrate of a chemical mechanical polishing aqueous dispersion of Example 10 was prepared in the same manner as in Example 9 except for using the abrasive grains (A) used in Example 2 instead of the abrasive grains (A) used in Example 1, and changing the types and the amounts of the auxiliary particles (D) and the water-soluble polymer (C) as shown in Table 3. A concentrate of a chemical mechanical polishing aqueous dispersion of Example 11 was prepared in the same manner as in Example 9 except for changing the types and the amounts of the auxiliary particles (D) and the water-soluble polymer (C) as shown in Table 3.

The concentrate was subjected to the chemical mechanical polishing test described in 3-1-6 in the same manner as in Example 1. The results are shown in Table 2.

Concentrates of chemical mechanical polishing aqueous dispersions of Comparative Examples 6 and 7 were obtained in the same manner as in Examples 10 and 11 except for using ceria having properties shown in Table 1 as the abrasive grains (A). The concentrate was subjected to the chemical mechanical polishing test described in 3-1-6.

As shown in Table 1, the number of defects and the number of scratches were small when polishing an insulating layer using the chemical mechanical polishing aqueous dispersions of Examples 9 to 11. It was confirmed that the chemical mechanical polishing aqueous dispersions of Examples 9 to 11 had an excellent performance as a chemical mechanical polishing aqueous dispersion used when removing unnecessary insulating layer during formation of a shallow trench isolation region.

As is clear from the results of Comparative Examples 6 and 7, the number of defects and the number of scratches were large when the pore volume of the abrasive grains (A) was less than 0.14 ml/g. Therefore, the aqueous dispersions of Comparative Examples 6 and 7 are not suitable as a chemical mechanical polishing aqueous dispersion.

3-5. Reference Example 1

A concentrate of a chemical mechanical polishing aqueous dispersion of Reference Example 1 was prepared in the same manner as in Example 9 except for using the abrasive grains (A) used in Example 3 instead of the abrasive grains (A) used in Example 1 and using the anionic organic polymer particles (d) as the auxiliary particles (D). The concentrate was subjected to the chemical mechanical polishing test described in 3-1-6 in the same manner as in Example 9. As shown in Table 2, the number of defects and the number of scratches increased when using the anionic organic polymer (d), differing from Example 9. Therefore, the aqueous dispersion of Reference Example 1 is not suitable as a chemical mechanical polishing aqueous dispersion.

3-6. Reference Examples 2 and 3

Chemical mechanical polishing aqueous dispersions of Reference Examples 2 and 3 were obtained in the same manner as in Example 9 except for changing the content of the anionic water-soluble polymer (C) to 0.1 mass % and 10 mass %, respectively.

As is clear from the results of Reference Example 2 shown in Table 2, the stability of the chemical mechanical polishing aqueous dispersion was very poor when the content of the anionic water-soluble polymer (C) was 0.1 mass %. The average particle diameter of the chemical mechanical polishing aqueous dispersion exceeded 1 micrometer and the maximum particle diameter of the chemical mechanical polishing aqueous dispersion exceeded 5 micrometers so that the aqueous dispersion was partially filtered off. As is clear from the results of Reference Example 3, the polishing rate of the chemical mechanical polishing aqueous dispersion decreased to 5 nm/min when the content of the anionic water-soluble polymer (C) was 10 mass %.

In the case of Reference Example 2, it was confirmed that the stability of the chemical mechanical polishing aqueous dispersion was very poor and cannot be used for chemical mechanical polishing when the amount of the water-soluble polymer (C) is less than 5 parts by mass based on the amount (100 parts by mass) of the abrasive grains (A). In the case of Reference Example 3, it was confirmed that the polishing rate of the chemical mechanical polishing aqueous dispersion decreased to a large extent and cannot be used for chemical mechanical polishing the amount of the water-soluble polymer (C) is more than 100 parts by mass based on the amount (100 parts by mass) of the abrasive grains (A).

TABLE 3

| | Abrasive grains (A) | | Auxiliary particles (D) | | Water-soluble polymer (C) | |
|---|---|---|---|---|---|---|
| | Pore volume | Content (mass %) | Type | Content (mass %) | Type | Content (mass %) |
| Example 9 | 0.16 | 5.0 | (a) | 1.0 | Ammonium polyacrylate (1) (MW 10,000) | 2.0 |
| Example 10 | 0.14 | 5.0 | (b) | 0.5 | Ammonium polyacrylate (2) (MW 6000) | 1.0 |
| Example 11 | 0.16 | 5.0 | (c) | 3.0 | Polyisoprenesulfonate ammonium (MW 700,000) | 2.0 |
| Comparative Example 5 | 0.07 | 5.0 | (a) | 1.0 | Ammonium polyacrylate (1) (MW 10,000) | 2.0 |
| Comparative Example 6 | 0.12 | 5.0 | (b) | 0.5 | Ammonium polyacrylate (2) (MW 6000) | 1.0 |
| Comparative Example 7 | 0.07 | 5.0 | (c) | 3.0 | Polyisoprenesulfonate ammonium (MW 700,000) | 2.0 |
| Reference Example 1 | 0.18 | 5.0 | (d) | 0.5 | Ammonium polyacrylate (1) (MW 10,000) | 2.0 |
| Reference Example 2 | 0.16 | 5.0 | (a) | 0.5 | Ammonium polyacrylate (1) (MW 10,000) | 0.1 |
| Reference Example 3 | 0.16 | 5.0 | (a) | 0.5 | Ammonium polyacrylate (1) (MW 10,000) | 10.0 |

The chemical mechanical polishing method according to the invention enables unnecessary insulating layer or conductive layer to be removed at a high polishing rate, and enables an insulating layer or a conductive layer with a small number of scratches to be obtained.

The chemical mechanical polishing aqueous dispersion and the chemical mechanical polishing method according to the invention may be suitably used to planarize a conductive layer or an insulating layer used in the production of semiconductor devices, for example.

Specifically, the chemical mechanical polishing aqueous dispersion according to the invention may be suitably used to planarize an insulating layer in a shallow trench isolation (trench isolation) step in the production of semiconductor devices, for example.

The invention claimed is:

1. A chemical mechanical polishing aqueous dispersion comprising (A) inorganic particles comprising ceria having a pore volume of 0.14 ml/g or more, (B) a dispersion medium comprising water, (C) 5 to 100 parts by mass, relative to 100 parts by mass of said inorganic particles, of an anionic water-soluble polymer, and (D) 5 to 100 parts by mass, relative to 100 parts by mass of said inorganic particles, of cationic organic polymer particles.

2. The chemical mechanical polishing aqueous dispersion according to claim 1, wherein the inorganic particles (A) have a specific surface area determined by a BET method of 15 m²/g or more and a D99 value of 1 micrometer or less, the D99 value being a particle diameter when a total volume ratio obtained by integrating a volume ratio of particles in an ascending order of particle diameter reaches 99% in a volume particle size distribution obtained by particle size distribution measurement using laser diffractometry.

3. The chemical mechanical polishing aqueous dispersion according to claim 1, wherein the inorganic particles (A) consist of ceria.

4. A chemical mechanical polishing method, comprising polishing and planarizing a conductive layer or an insulating layer with the aqueous dispersion according to claim 1.

5. The chemical mechanical polishing aqueous dispersion according to claim 1, wherein the inorganic particles (A) comprise ceria and one or more components selected from the group consisting of silica, alumina, titanium oxide, chromium oxide, manganese dioxide, manganic oxide, iron oxide, zirconium oxide, silicon carbide, boron carbide, diamond, and barium carbonate.

6. The chemical mechanical polishing aqueous dispersion according to claim 1, wherein the inorganic particles (A) have a pore volume of 0.14 ml/g or more and 0.30 ml/g or less.

7. The chemical mechanical polishing aqueous dispersion according to claim 1, wherein the inorganic particles (A) have a pore volume of 0.15 ml/g or more and 0.25 ml/g or less.

8. The chemical mechanical polishing aqueous dispersion according to claim 1, wherein the dispersion medium comprises water and an organic solvent which is miscible with water, or comprises water and an alcohol.

9. The chemical mechanical polishing aqueous dispersion according to claim 2, wherein the inorganic particles (A) have a pore volume of 0.14 ml/g or more and 0.30 ml/g or less.

10. The chemical mechanical polishing aqueous dispersion according to claim 2, wherein the inorganic particles (A) have a pore volume of 0.15 ml/g or more and 0.25 ml/g or less.

11. The chemical mechanical polishing aqueous dispersion according to claim 1, further comprising at least one of a pH adjusting agent (E), a surfactant (F), and a preservative (G).

* * * * *